(12) United States Patent
Iijima

(10) Patent No.: US 9,324,860 B2
(45) Date of Patent: Apr. 26, 2016

(54) SEMICONDUCTOR DEVICE

(71) Applicant: Kabushiki Kaisha Toshiba, Tokyo (JP)

(72) Inventor: Ryosuke Iijima, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/543,054

(22) Filed: Nov. 17, 2014

(65) Prior Publication Data

US 2015/0069400 A1    Mar. 12, 2015

Related U.S. Application Data

(62) Division of application No. 13/710,572, filed on Dec. 11, 2012, now abandoned.

(30) Foreign Application Priority Data

Mar. 26, 2012    (JP) ................................. 2012-070399

(51) Int. Cl.
 *H01L 21/70* (2006.01)
 *H01L 29/78* (2006.01)
 (Continued)

(52) U.S. Cl.
 CPC ............ *H01L 29/7816* (2013.01); *H01L 29/04* (2013.01); *H01L 29/1095* (2013.01);
 (Continued)

(58) Field of Classification Search
 CPC .................. H01L 29/66659–29/66719; H01L 29/7787–29/7802; H01L 29/7835–29/7836; H01L 29/66484; H01L 2924/10272; H01L 21/02378; H01L 21/02447
 See application file for complete search history.

(56) References Cited

U.S. PATENT DOCUMENTS 6,573,534 B1 * 6/2003 Kumar et al. ................... 257/77
2007/0042559 A1 2/2007 Niimi et al.
(Continued)

FOREIGN PATENT DOCUMENTS

JP    62-47163 A    2/1987
JP    6-61482 A    3/1994
(Continued)

OTHER PUBLICATIONS

R. Kosugi et al. "Fabrication of double implanted (0001) 4H-SiC MOSFETs by using pyrogenic re-oxidation annealing", Materials Science Forum vols. 457-460 (2004), pp. 1397-1400.
(Continued)

*Primary Examiner* — David Vu
*Assistant Examiner* — Cuong Nguyen
(74) *Attorney, Agent, or Firm* — Oblon, McClelland, Maier & Neustadt, L.L.P.

(57) ABSTRACT

According to one embodiment, a semiconductor device includes a first semiconductor region, a second semiconductor region, a third semiconductor region, an insulating film, and a control electrode. The first semiconductor region includes a silicon carbide of a first conductivity type. The second semiconductor region is provided on the first semiconductor region, includes a silicon carbide of a second conductivity type, and has a first main surface. The third semiconductor region is provided on the second semiconductor region and includes the silicon carbide of the first conductivity type. The film is provided on the surface. The electrode is provided on the film, and has a first region close to the third semiconductor region side, and a second region closer to the first semiconductor region side than the first region. An effective work function of the first region is larger than an effective work function of the second region.

15 Claims, 12 Drawing Sheets

(51) Int. Cl.
　　　*H01L 29/66*　　　(2006.01)
　　　*H01L 29/739*　　(2006.01)
　　　*H01L 29/16*　　　(2006.01)
　　　*H01L 29/04*　　　(2006.01)
　　　*H01L 29/10*　　　(2006.01)
　　　H01L 29/49　　　(2006.01)
　　　H01L 29/06　　　(2006.01)

(52) U.S. Cl.
　　　CPC ............ *H01L29/16* (2013.01); *H01L 29/1608* (2013.01); *H01L 29/4983* (2013.01); *H01L 29/66068* (2013.01); *H01L 29/7395* (2013.01); *H01L 29/78* (2013.01); *H01L 29/7802* (2013.01); *H01L 29/0653* (2013.01); *H01L 29/495* (2013.01); *H01L 29/4958* (2013.01); *H01L 29/4966* (2013.01)

(56) References Cited

U.S. PATENT DOCUMENTS

2010/0038729　A1　2/2010　Eimori et al.
2010/0059817　A1　3/2010　Pham et al.

FOREIGN PATENT DOCUMENTS

| JP | 2001-156288 | A | 6/2001 |
| JP | 2007-12684 | A | 1/2007 |
| JP | 2010-45210 | A | 2/2010 |
| JP | 2011-211232 | A | 10/2011 |

OTHER PUBLICATIONS

Chao-Yang Lu et al. "Effect of Process Variations and Ambient Temperature on Electron Mobility at the $SiO_2$/4H-SiC Interface", IEEE Transactions on Electron Devices, vol. 50, No. 7, Jul. 2003, pp. 1582-1588.

Office Action issued Apr. 16, 2014 in Japanese Patent Application No. 2012-070399 (with English language translation).

T.J. Hwang, S.H. Rogers, B.Z. Li, "work function measurement of tungsten polycide gate structures", Feb. 28, 1983, Journal of Electronic Materials, vol. 12, No. 4, pp. 667-679.

* cited by examiner

SEMICONDUCTOR DEVICE

This application is a divisional application of U.S. Ser. No. 13/710,572 filed on Dec. 11, 1012.

CROSS-REFERENCE TO RELATED APPLICATIONS

This application is based upon and claims the benefit of priority from the prior Japanese Patent Application No. 2012-070399, filed on Mar. 26, 2012; the entire contents of which are incorporated herein by reference.

FIELD

Embodiments described herein relate generally to a semiconductor device.

BACKGROUND

A silicon carbide (SiC) has an excellent physical property such that a band gap is triple, a breakdown electric field intensity is about tenfold and a thermal conductivity is about triple, in comparison with a silicon (Si). It is possible to realize a semiconductor device which has a low loss and is excellent in a high temperature operation, by using a characteristic of the SiC mentioned above.

In the semiconductor device using the SiC, in order to improve an electron transfer degree of an inversion layer and improve a reliability of a gate insulating film, it has been known to use a silicon dioxide ($SiO_2$) added a nitrogen (N) as the gate insulating film.

In the semiconductor device using the SiC mentioned above, it is important to adjust a threshold value of a gate voltage without deteriorating a current and voltage property.

DETAILED DESCRIPTION

Figure 1A:
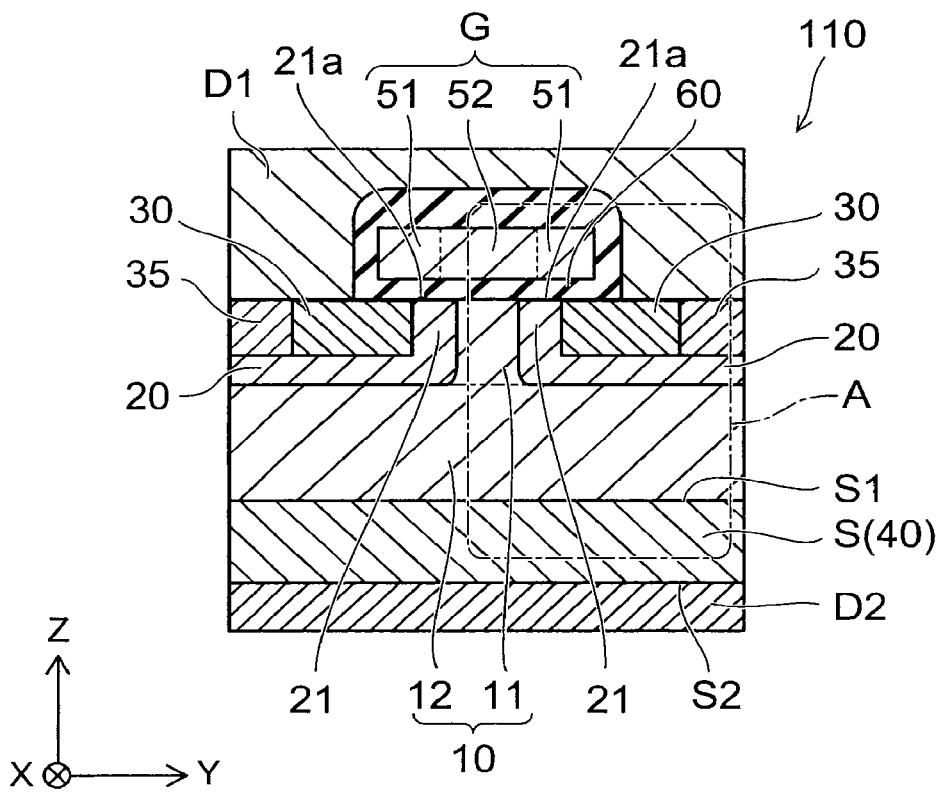
FIGS. 1A and 1B are schematic cross sectional views illustrating a configuration of a semiconductor device according to a first embodiment.

In general, according to one embodiment, a semiconductor device includes a first semiconductor region, a second semiconductor region, a third semiconductor region, an insulating film, and a control electrode. The first semiconductor region includes a silicon carbide of a first conductivity type. The second semiconductor region is provided on the first semiconductor region. The second semiconductor region includes a silicon carbide of a second conductivity type. The second semiconductor region has a first main surface. The third semiconductor region is provided on the second semiconductor region. The third semiconductor region includes the silicon carbide of the first conductivity type. The insulating film is provided at least on the first main surface of the second semiconductor region. The control electrode is provided on the insulating film. The control electrode has a first region close to the third semiconductor region side, and a second region closer to the first semiconductor region side than the first region. An effective work function of the first region is larger than an effective work function of the second region.

Various embodiments will described hereinafter with reference to accompanying drawings.

The drawings are schematic and conceptual, and a relationship between a thickness and a width in each of the portions, and a rate of a magnitude between the portions are not necessarily identical to actual ones. Further, even in the case of showing the same portion, there is a case that the mutual dimensions and the rate are differently shown according to the drawings.

Further, in the specification and each of the drawings of the present application, the same reference numerals are attached to the same element as mentioned above with regard to the previously provided drawings, and a detailed description thereof will be appropriately omitted.

Further, in the following description, a specific example in which a first conductivity type is an n-type and a second conductivity type is a p-type is listed up as one example.

In the following description, reference symbols $n^+$, n, $n^-$, $p^+$, p and $p^-$ denote relative heights of an impurity concentration in each of the conductivity types. In other words, $n^+$ indicates that the n-type impurity concentration is relatively higher than n, and $n^-$ indicates that the n-type impurity concentration is relatively lower than n. Further, $p^+$ indicates that the p-type impurity concentration is relatively higher than p, and $p^-$ indicates that the p-type impurity concentration is relatively lower than p.

First Embodiment

Figure 1B:
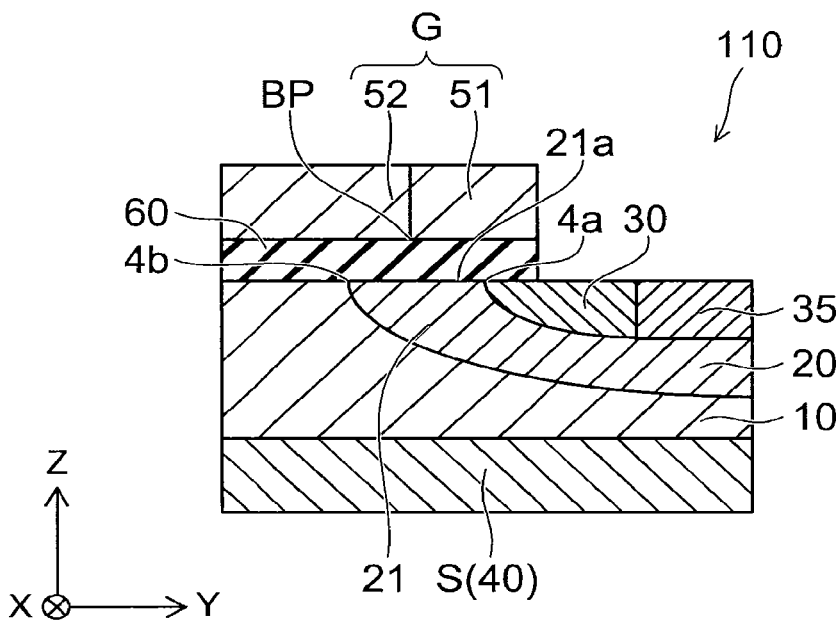

FIGS. 1A and 1B are schematic cross sectional views illustrating a configuration of a semiconductor device according to a first embodiment.

FIG. 1A shows a schematic cross sectional view of a semiconductor device 110 according to the first embodiment, and FIG. 1B shows a schematic enlarged cross sectional view of a portion A in FIG. 1A.

As shown in FIGS. 1A and 1B, the semiconductor device 110 according to the embodiment is provided with a first semiconductor region 10, a second semiconductor region 20, a third semiconductor region 30, an insulating film 60, and a control electrode G.

The semiconductor device 110 is a metal oxide semiconductor field effect transistor (MOSFET) including the silicon carbide (SiC).

The first semiconductor region 10 includes the SiC of a first conductivity type ($n^-$-type). The first semiconductor region 10 is formed on an upper face S1 of a substrate S which includes the SiC of the first conductivity type ($n^+$-type) shown in FIG. 1A, for example, by an epitaxial growth.

In this case, in the embodiment, a direction which is orthogonal to the upper face S1 of the substrate S is referred to as a Z direction, one of directions which are orthogonal to the Z direction is referred to as an X direction, and a direction which is orthogonal to the Z direction and the X direction is referred to as a Y direction. Further, a direction which heads for the first semiconductor region 10 from the substrate S is referred to as an upper (an upper side), and a direction which heads for the substrate S from the first semiconductor region 10 is referred to as a lower (a lower side).

The first semiconductor region 10 has a first portion 11 and a second portion 12. The first portion 11 is provided on a part of the second portion 12. The first portion 11 is a junction field effect transistor (JFET) region of the MOSFET. The second portion 12 is a drift region of the MOSFET.

The second semiconductor region 20 is provided on the first semiconductor region 10. The second semiconductor region 20 has a channel portion 21. An upper face of the channel portion 21 is a first main surface 21a. The channel portion 21 is provided adjacent to the first portion 11. The second semiconductor region 20 includes the SiC of a second conductivity type (p-type). In other words, the second semiconductor region 20 is provided in the other portion than the part in which the first portion 11 is provided on the second portion 12. The second semiconductor region 20 is a p-type well of the MOSFET.

A third semiconductor region 30 is provided on the second semiconductor region 20. The third semiconductor region 30 is provided in a surface layer portion of the second semiconductor region 20 and includes the SiC of the first conductivity type ($n^+$-type). The third semiconductor region 30 is a source region of the MOSFET.

The insulating film 60 is provided at least on the first main surface 21a of the second semiconductor region 20. The insulating film 60 which is provided between the first main surface 21a and a control electrode G mentioned later is a gate insulating film of the MOSFET. Further, the insulating film 60 serves as a film which insulates between the control electrode G and a first electrode D1 mentioned later. For example, a silicon oxide added a nitrogen is used as the insulating film 60.

The control electrode G is provided on the insulating film 60. In other words, the control electrode G is provided via the insulating film 60 which is provided on the first main surface 21a. As a result, the control electrode G serves as a gate electrode of the MOSFET.

The control electrode G has a first region 51 close to the third semiconductor region side, and a second region 52 closer to the first semiconductor region 10 side than the first region 51. As in the example shown in FIG. 1A, in the case that a pair of second semiconductor regions 20 and a pair of third semiconductor regions 30 are provided with respect to one control electrode G, the first region 51 is provided in both end sides in the Y direction of one control electrode G, and the second region 52 is provided in a center portion.

In the semiconductor device 110, an effective work function of the first region 51 is larger than an effective work function of the second region 52.

In the semiconductor device 110 according to the embodiment, a threshold value of a gate voltage is adjusted by the control electrode G, without deteriorating the current and voltage property.

In the semiconductor device 110, a fourth semiconductor region 40 is provided in the substrate S. The fourth semiconductor region 40 includes the SiC of the first conductivity type ($n^+$-type). The fourth semiconductor region 40 is provided in the direction (the Z direction) which is orthogonal to the first main surface 21a so as to be spaced from the second semiconductor region 20. The fourth semiconductor region 40 is a drain region of the MOSFET. By providing the fourth semiconductor region 40 mentioned above, the semiconductor device 110 is configured to be a vertical type MOSFET.

A fifth semiconductor region 35 is provided in the semiconductor device 110. The fifth semiconductor region 35 is provided in an opposite side to the channel portion 21 of the third semiconductor region 30 on the second semiconductor region 20. The fifth semiconductor region 35 includes the SiC of the second conductivity type ($p^+$-type). The fifth semiconductor region 35 is used as a contact region with the first electrode D1 mentioned later.

The first electrode D1 is provided in the semiconductor device 110. The first electrode D1 is electrically connected with the third semiconductor region 30. The first electrode D1 is electrically insulated from the control electrode G by the insulating film 60. The first electrode D1 comes into contact with the third semiconductor region 30. The first electrode D1 is a source electrode of the MOSFET.

In the embodiment, the first electrode D1 also comes into contact with a fifth semiconductor region 50. As a result, the first electrode D1 serves as a common electrode of the source region of the MOSFET and the p-type well.

A second electrode D2 is provided in the semiconductor device 110. The second electrode D2 is electrically connected with the fourth semiconductor region 40. The second electrode D2 is provided in a lower face S2 in an opposite side to the upper face S1 of the substrate S. The second electrode D2 is a drain electrode of the MOSFET.

Next, a description will be given of a specific example of the semiconductor device 110 according to the first embodiment.

As shown in FIG. 1B, an n-type impurity having a high concentration is introduced into the fourth semiconductor region 40 (the drain region) which is provided in the substrate S. The second portion 12 (the drift layer) of the first semiconductor region 10 added the n-type impurity having a low concentration is introduced is connected to the fourth semiconductor region 40.

The second semiconductor region 20 (the p-type well) added the p-type impurity is introduced is provided on a surface of the first semiconductor region 10, and the third semiconductor region 30 (the source region) added the n-type impurity having a high concentration is introduced is provided on a surface of the second semiconductor region 20. The fifth semiconductor region 35 (the contact region) added the p-type impurity having a high concentration is introduced is provided in the surface of the second semiconductor region 20 in such a manner as to come into contact with the third semiconductor region 30.

The insulating film 60 (the gate insulating film) is provided on the first portion 11 of the first semiconductor region 10, the channel portion 21 of the second semiconductor region 20 and the third semiconductor region 30.

The first region 51 and the second region 52 serving as the control electrode G (the gate electrode) are provided on the insulating film 60.

The thicknesses of the first region 51 and the second region 52 are, for example, not less than 10 nanometer (nm) and not more than 10 millimeter (mm).

The effective work function of the first region 51 is larger than the effective work function of the second region 52.

For example, a platinum (Pt) is used for a material of the first region 51. For example, at least any of an aluminum (Al) and a titanium nitride (TiN) is used for a material of the second region 52. A composition of the element included in the first region 51 is different from a composition of the element included in the second region 52.

The first region 51 may be provided over a whole region in the direction (the X direction) in which the control electrode G extends, or may be provided in a part in the X direction.

In the control electrode G, the other region having an effective work function than the first region 51 and the second region 52 may be provided. In this case, a direction which connects the first semiconductor region 10 and the third semiconductor region 30 along the first main surface 21a is set to the first direction (the Y direction), a region which is closest to the third semiconductor region 30 in the Y direction is set to the first region 51, and a region which is adjacent to the first region 51 in the Y direction is set to the second region 52.

In the semiconductor device 110, a boundary position BP between the first region 51 and the second region 52 is provided at a position which overlaps the first main surface 21a as view in the direction (the Z direction) which is orthogonal to the first main surface 21a. In other words, the boundary position BP in an interface between the control electrode G and the insulating film 60 exists above a region which is sandwiched by a boundary (hereinafter, refer to as a source end 4a) between the second semiconductor region 20 and the third semiconductor region 30 in the first main surface 21a, and a boundary (hereinafter, refer to as a drain end 4b) between the second semiconductor region 20 and the first semiconductor region 10. Further, it is desired that a distance in the Y direction from the drain end 4b to the boundary position BP becomes shorter than a distance in the Y direction from the source end 4a to the boundary position BP.

In this case, a description will be given of a favorable example of the boundary position.

Figure 2:
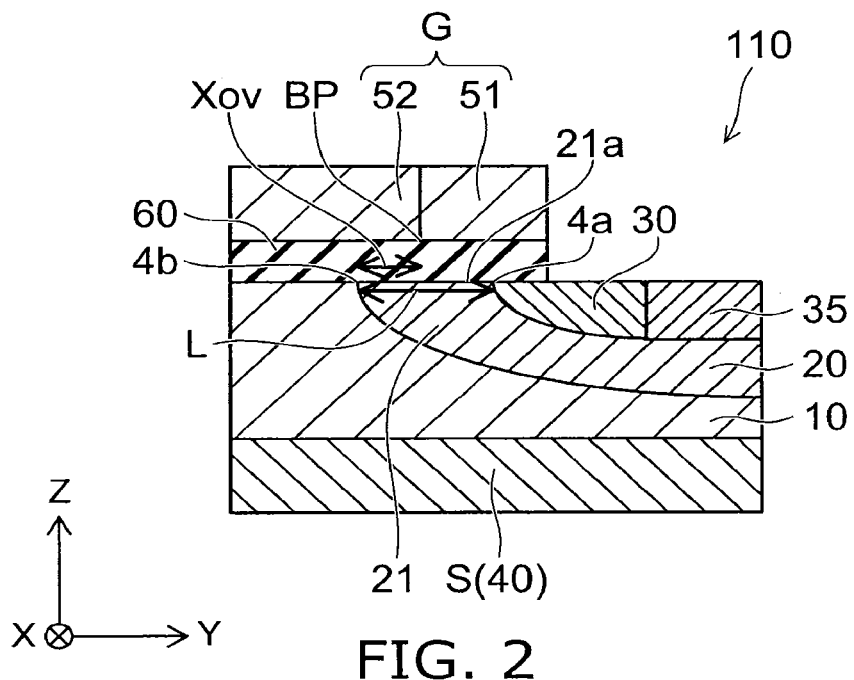
FIG. 2 is a schematic cross sectional view illustrating the boundary position.

FIG. 2 is a schematic cross sectional view illustrating the boundary position.

Figure 3:
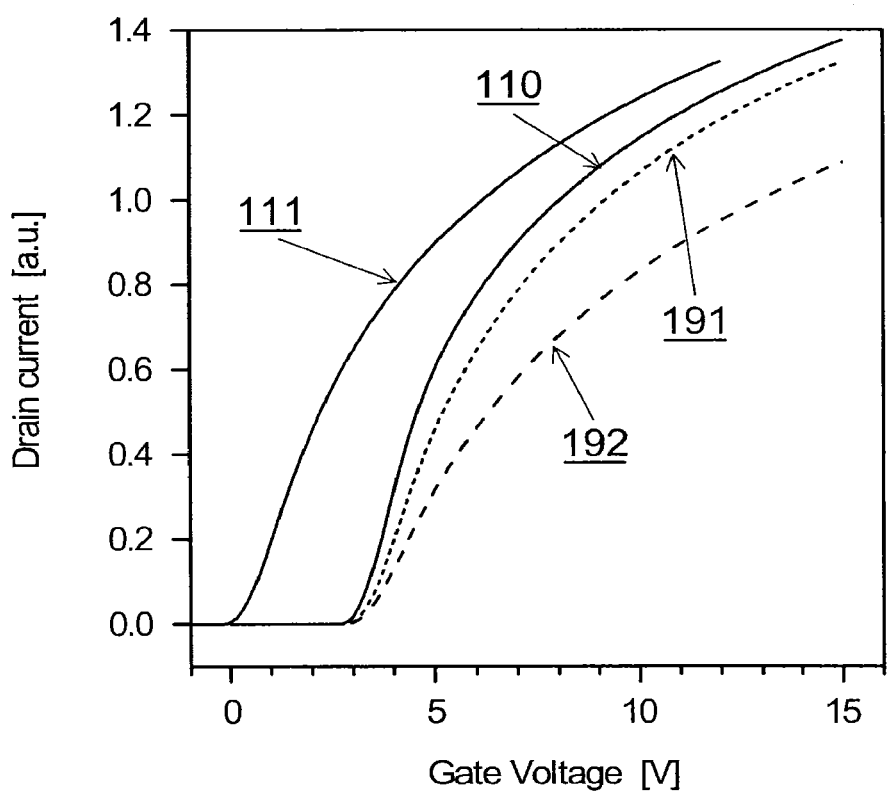
FIG. 3 is a view showing a drain electric property of the semiconductor device.

FIG. 3 is a view showing a drain electric property of the semiconductor device.

Figure 4:
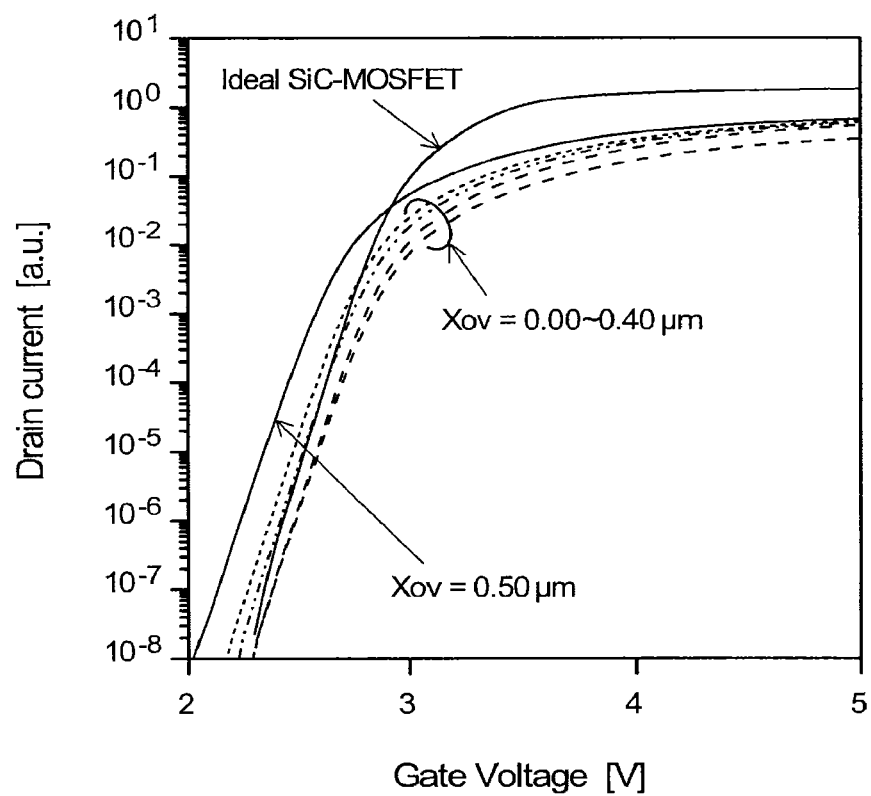
FIG. 4 is a view showing a gate voltage dependency of the drain current.

FIG. 4 is a view showing a gate voltage dependency of the drain current.

FIG. 2 shows a definition of the boundary position BP between the first region 51 and the second region 52 of the control electrode G. As shown in FIG. 2, a distance (a channel length) in the Y direction between the source end 4a and the drain end 4b is set to L, and a distance in the Y direction from the drain end 4b to the boundary position BP is set to Xov. The property of the semiconductor device 110 is adjusted by the Xov.

FIG. 3 shows a comparison of the drain current property (a horizontal axis is a gate voltage, and a vertical axis is a drain current) of the vertical type MOSFET. In this case, the drain current property of the various vertical type MOSFET is simulated by assuming the distance L to 1 micrometer (μm). FIG. 3 shows results of simulation of the drain current property of the semiconductor devices 110 and 111 according to the embodiment, and semiconductor devices 191 and 192 according to reference examples.

In the semiconductor device 110 according to the embodiment, Xov=0.35 μm is established. In the semiconductor device 111, Xov=0.0 μm is established. In the semiconductor device 191 according to the first reference example, all the control electrodes G are formed of the same material as the first region 51 (equivalent to Xov<0). In semiconductor device 192 according to the second reference example, all the control electrodes G are formed of the same material as the second region 52, and the p-type impurity is additionally implanted into the channel portion 21 (equivalent to Xov>L).

As shown in FIG. 3, in the semiconductor devices 110 and 111 according to the embodiment, a clear increase of the drain current is confirmed in comparison with the semiconductor devices 191 and 192 according to the reference examples. In the semiconductor device 111, the drain current is increased, however, the threshold value of the gate voltage is lower than that of the other semiconductor devices 110, 191 and 192.

On the basis of the result of simulation, $0 \leq Xov \leq L$ is desired. In other words, it is desired that the boundary position BP is provided at a position which overlaps the first main surface 21a as view in the Z direction. Furthermore, $0 < Xov$ is further desired. In this case, an error in manufacturing is included in Xov=0 and Xov=L. Further, in the semiconductor device 110 according to the embodiment, Xov may be slightly less than 0 or may be slightly more than L, according to a specification.

FIG. 4 shows a result obtained by simulation calculating a gate voltage dependency of the drain current. In the simulation calculation, Xov is changed step by step from 0.0 μm to 0.50 μm. For comparison, an electric property ("Ideal SiC-MOSFET" curve) of a virtual SiC vertical MOSFET having an ideal MOS interface is shown.

A threshold voltage in the case that Xov is not less than 0.25 μm and not more than 0.5 μm is the same level as a threshold voltage of the virtual vertical type MOSFET. In the case of Xov=0.50 μm, it is understood that the threshold value becomes lower in comparison with the virtual vertical MOSFET. This is because a potential controllability of the surface of the channel portion 21 by the control electrode G (the gate electrode) in the vicinity of the source region is lowered, since the boundary position BP comes close to the third semiconductor region 30 (the source region) according to the increase of Xov.

Considering the calculation on the assumption of L=1 firm which is a typical channel length, these results show that Xov/L is desired to be not less than 0 and less than 0.5. by setting the Xov as mentioned above, in the semiconductor device 110 accordance with the embodiment, the threshold value of the gate voltage is adjusted without deteriorating the current and voltage property.

Figure 5A:
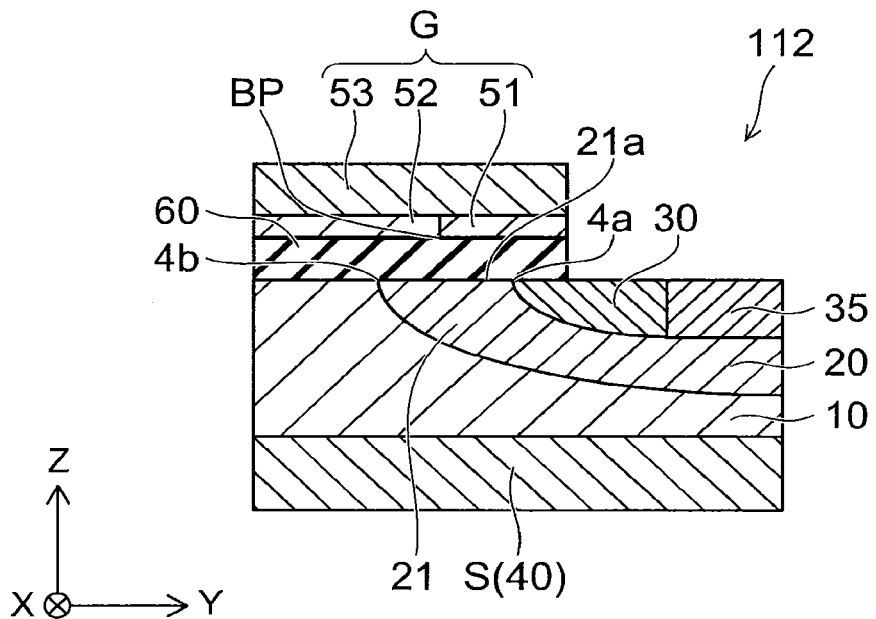
FIGS. 5A and 5B are schematic cross sectional views showing the other configuration example of the semiconductor device according to the first embodiment.
Figure 5B:
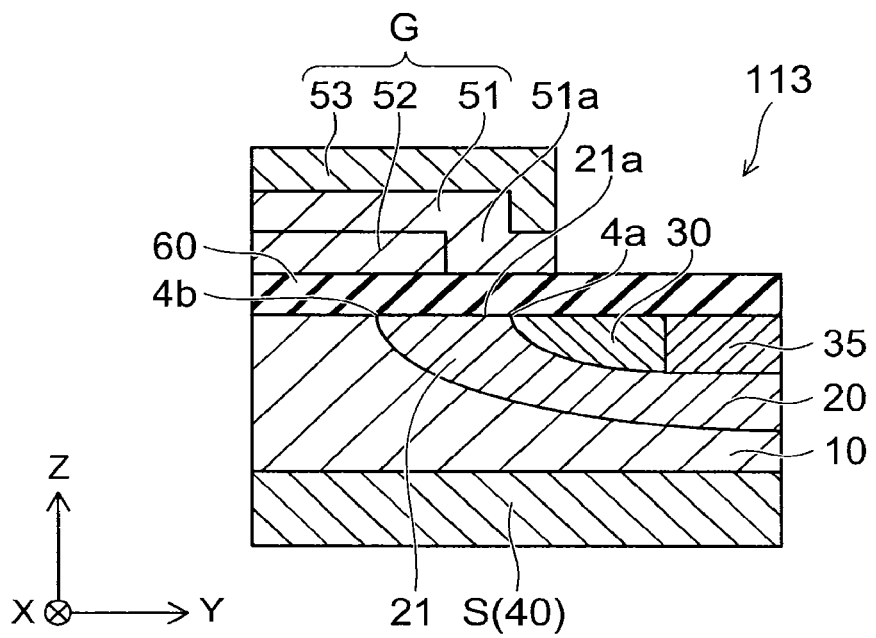

FIGS. 5A and 5B are schematic cross sectional views showing the other configuration example of the semiconductor device according to the first embodiment.

FIGS. 5A and 5B show an enlarged schematic cross sectional views of the periphery of the control electrode G.

In a semiconductor device 112 shown in FIG. 5A, the first region 51 and the second region 52 are provided in an boundary face side of the control electrode G with the insulating film 60. The control electrode G includes a third region 53 which is provided in an opposite side to the insulating film 60 of the first region 51 and the second region 52. An electric resistance value of the third region 53 is smaller than an electric resistance value of the first region 51 and an electric resistance value of the second region 52.

In a semiconductor device 113 shown in FIG. 5B, it is configured such that the first region 51 of the control electrode G covers the above of the second region 52. In other words, the first region 51 covers an upper face and a side face of the second region 52. A portion 51a which is provided in an outer side than the side face of the second region 52 in the first region 51 comes into contact with the insulating film 60 in a region which overlaps the first main surface 21a as view in the Z direction. The third region 53 may be provided on the second region 52.

In any of the semiconductor devices 112 and 113 shown in FIGS. 5A and 5B, the same operation and effect as the semiconductor device 110 can be obtained by setting Xov of the boundary position BP between the first region 51 and the second region 52 as mentioned above.

Next, a description will be given of a method of manufacturing the semiconductor device 113.

FIG. 6A to FIG. 7B are schematic cross sectional views which exemplify the method of manufacturing the semiconductor device.

Figure 6A:
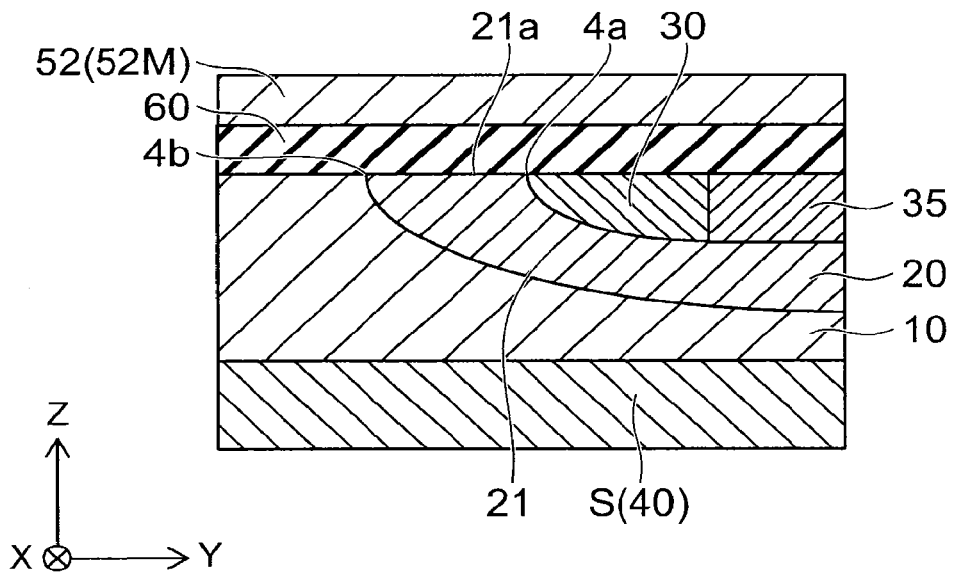
FIG. 6A to FIG. 7B are schematic cross sectional views which exemplify the method of manufacturing the semiconductor device.

First of all, as shown in FIG. 6A, the first semiconductor region 10, the second semiconductor region 20, the third semiconductor region 30, the fourth semiconductor region and the fifth semiconductor region 50 are formed by introducing each of the impurities to the substrate S of SiC. The first semiconductor region 10 and the second semiconductor region 20 may be formed by implanting the impurity to the substrate S or may be formed by an epitaxial growth on the substrate S.

Next, the insulating film 60 is formed on the first semiconductor region 10, the second semiconductor region 20, the third semiconductor region 30 and the fifth semiconductor region 50. For example, a silicon oxide added a nitrogen is used in the insulating film 60.

Next, a second region material 52M is deposited on the insulating film 60. A thickness of the second region material 52M is, for example, not less than 0.1 nm and not more than 10 nm. The second region material 52M is, for example, at least one which is selected from Al and TiN.

Figure 6B:
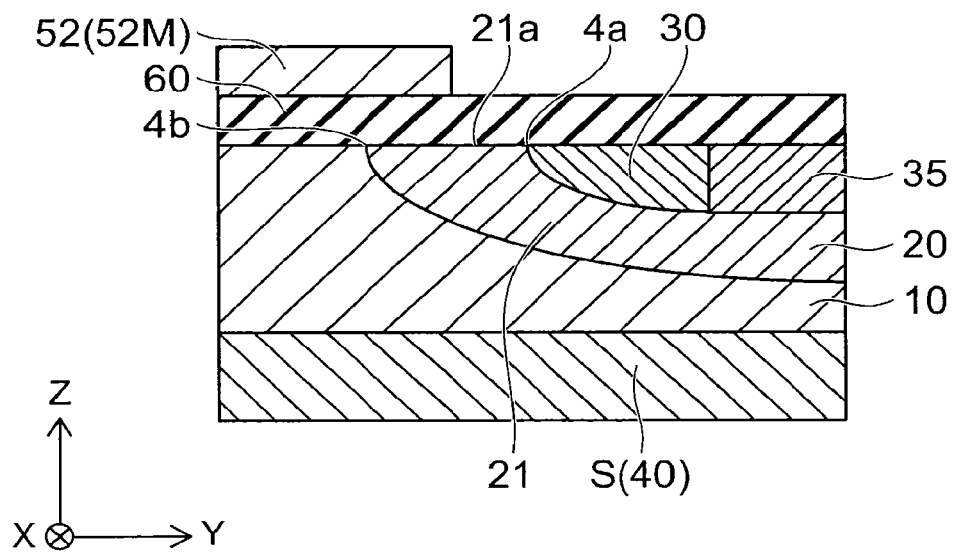

Next, a lithography process and an etching process are applied to the second region material 52M. As a result, the second region 52 is formed as shown in FIG. 6B.

Figure 7A:
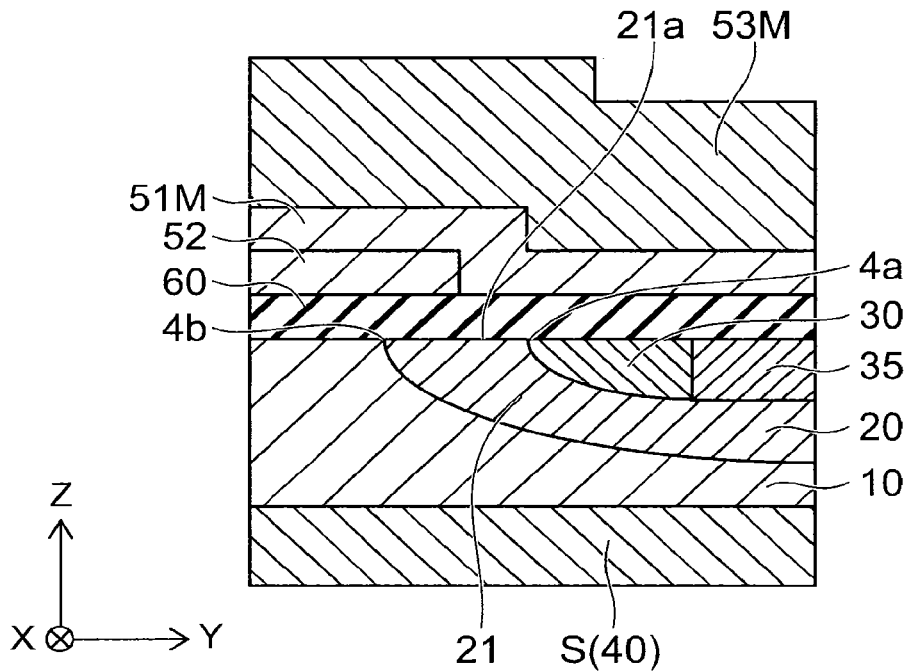

Next, as shown in FIG. 7A, a first region material 51M is deposited on the second region 52, and a third region material 53M is deposited on the first region material 51M. A thickness of the first region material 51M is, for example, not less than 0.1 nm and not more than 10 nm. The first region material 51M is, for example, Pt. A thickness of the third region material 53M is, for example, not less than 10 nm and not more than 10 mm. The third region material 53M is, for example, at least one which is selected from the n-type or p-type silicon, TiN, W, Al, TaN and NiSi.

Figure 7B:
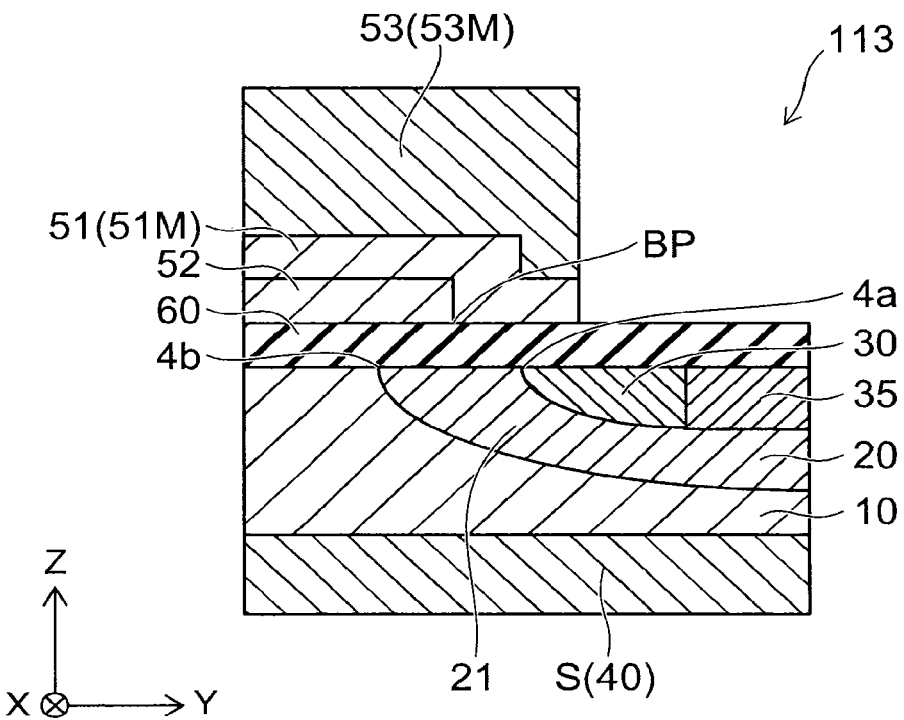

Next, the lithography process and the etching process are applied to the first region material 51M and the third region material 53M. As a result, as shown in FIG. 7B, the control electrode G having the first region 51 which covers the second region 52 and the third region 53 which is provided on the first region 51 is formed. As a result, the semiconductor device 113 is completed.

Second Embodiment

Figure 8:
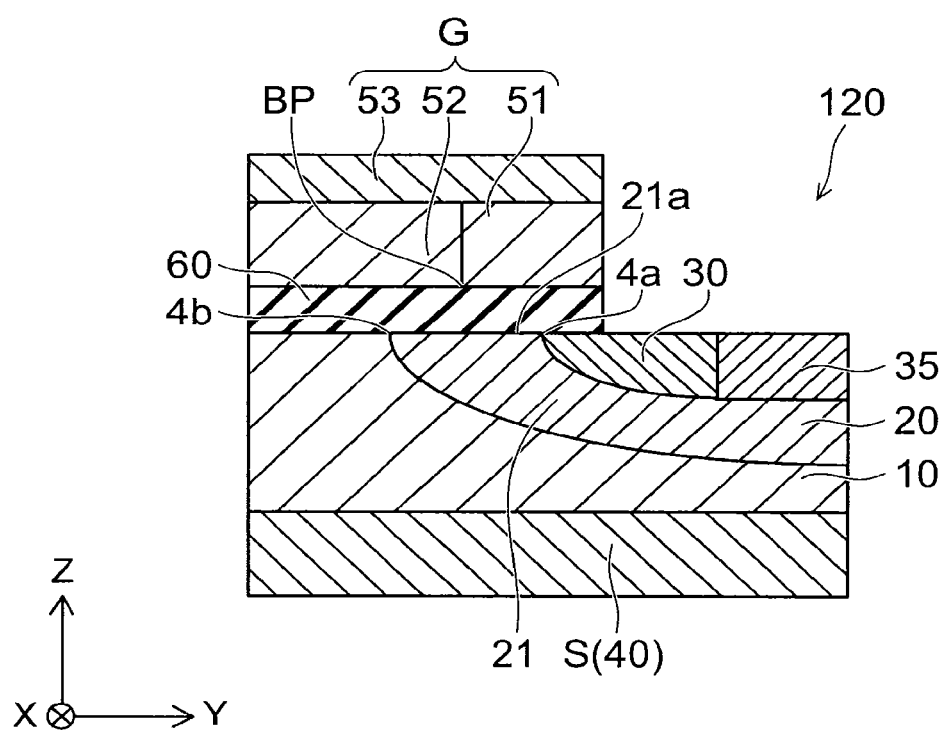
FIG. 8 is a schematic cross sectional view illustrating a configuration of a semiconductor device according to a second embodiment.

FIG. 8 is a schematic cross sectional view illustrating a configuration of a semiconductor device according to a second embodiment.

As shown in FIG. 8, in a semiconductor device 120 according to the second embodiment, the material of the control electrode G is different from the semiconductor device 110 according to the first embodiment.

In the semiconductor device 120, the first region 51 and the second region 52 include a polysilicon (polycrystalline silicon) added the impurity is implanted. For example, a p-type polysilicon is used in the first region 51, and an n-type polysilicon is used in the second region 52.

The control electrode G includes the third region 53 which is provided on the first region 51 and the second region 52. A material having a lower electric resistance value than the first region 51 and the second region 52 is used in the third region 53. For example, at least one which is selected from TiN, W, Al, TaN, Ni, Cu, NiSi and NiPtSi is used in the third region 53.

In the semiconductor device 120 according to the second embodiment, a threshold value of the gate voltage can be adjusted without deteriorating the current and voltage property by setting the boundary position BP between the first region 51 and the second region 52 in the same manner as the semiconductor device 110 according to the first embodiment. Further, since the polysilicon is used as the first region 51 and the second region 52, it is easy to process in comparison with the case of using a metal.

Next, a description will be given of a method of manufacturing the semiconductor device 120.

FIG. 9A to FIG. 11B are schematic cross sectional views which exemplify the method of manufacturing the semiconductor device.

Figure 9A:
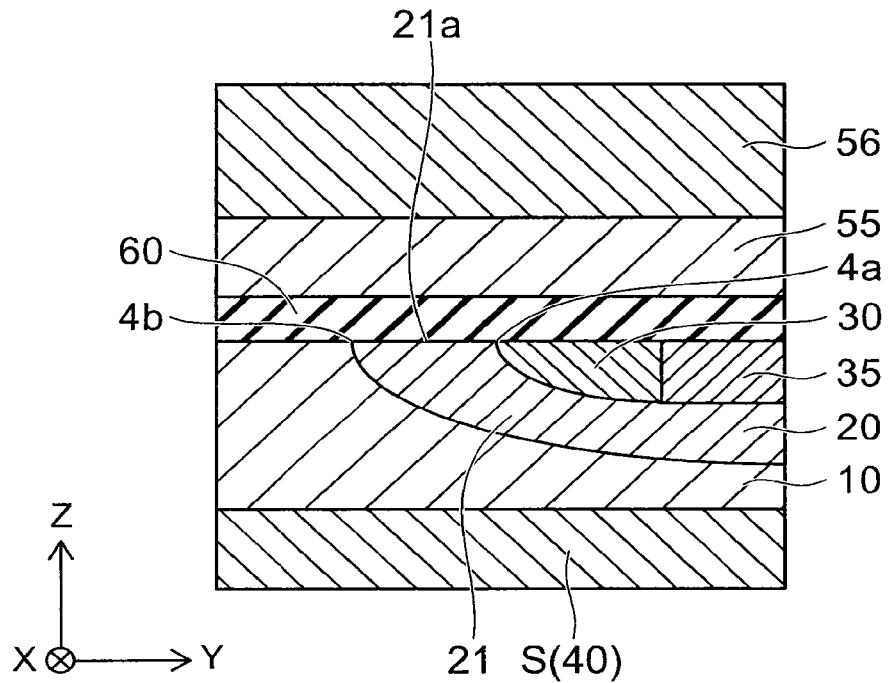
FIG. 9A to FIG. 11B are schematic cross sectional views which exemplify the method of manufacturing the semiconductor device.

First of all, as shown in FIG. 9A, the first semiconductor region 10, the second semiconductor region 20, the third semiconductor region 30, the fourth semiconductor region and the fifth semiconductor region 50 are formed by introducing each of the impurities to the substrate S of SiC. The first semiconductor region 10 and the second semiconductor region 20 may be formed by implanting the impurity to the substrate S or may be formed by an epitaxial growth on the substrate S.

Next, the insulating film 60 is formed on the first semiconductor region 10, the second semiconductor region 20, the third semiconductor region 30 and the fifth semiconductor region 50. For example, a silicon oxide added a nitrogen is used in the insulating film 60.

Next, a neutral polysilicon film 55 is deposited on the insulating film 60. A silicon oxide film 56 is deposited on the polysilicon film 55.

Figure 9B:
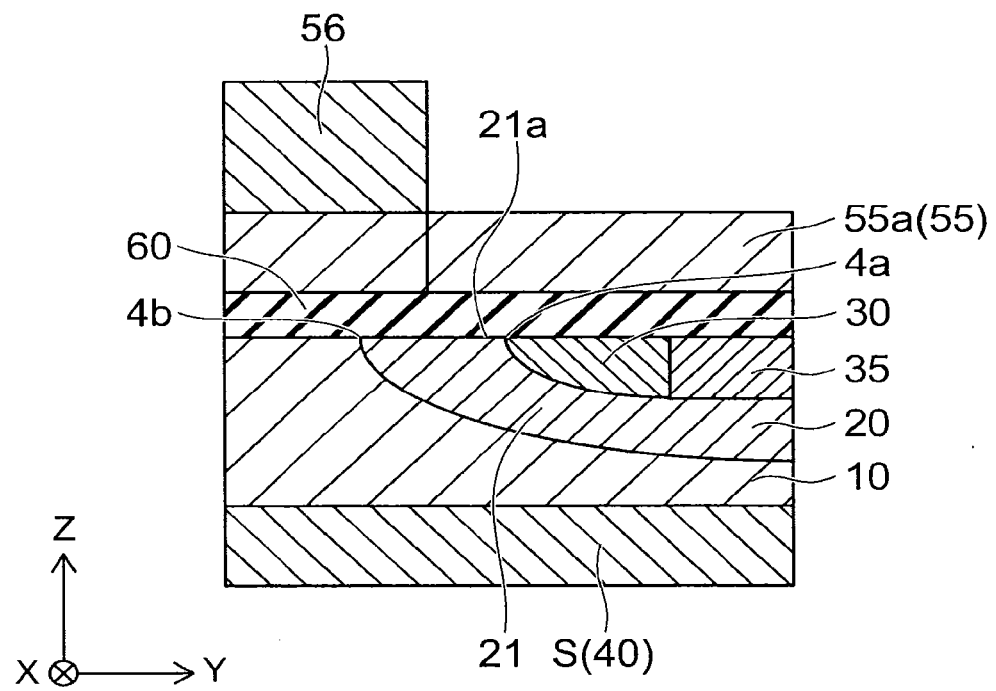

Next, as shown in FIG. 9B, a lithography process is applied to the silicon oxide film 56, and an anisotropic etching is thereafter carried out. As a result, a surface of a part of the polysilicon film 55 is exposed.

Thereafter, an ion-implantation is carried out by using the silicon oxide film 56 as a mask, and a p-type impurity is introduced to an exposed portion 55a of the polysilicon film 55.

Figure 10A:
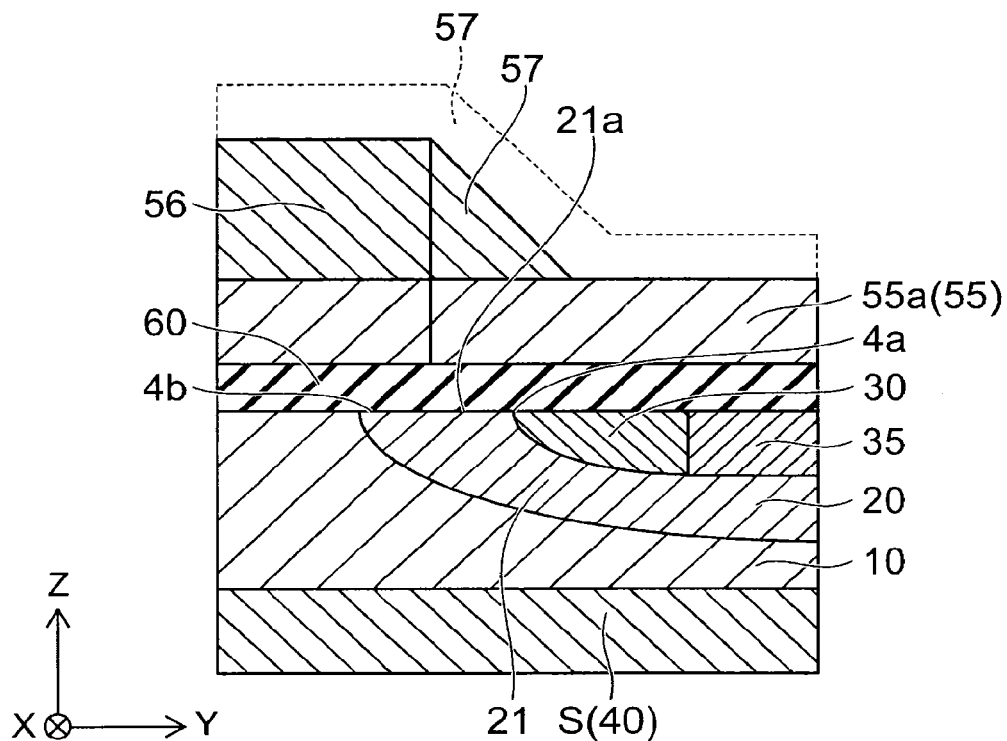

Next, as shown in FIG. 10A, a silicon nitride film 57 is left only on a side face of the silicon oxide film 56 by carrying out the anisotropic etching after depositing the silicon nitride film 57 on the silicon oxide film 56 and the first region 51.

Figure 10B:
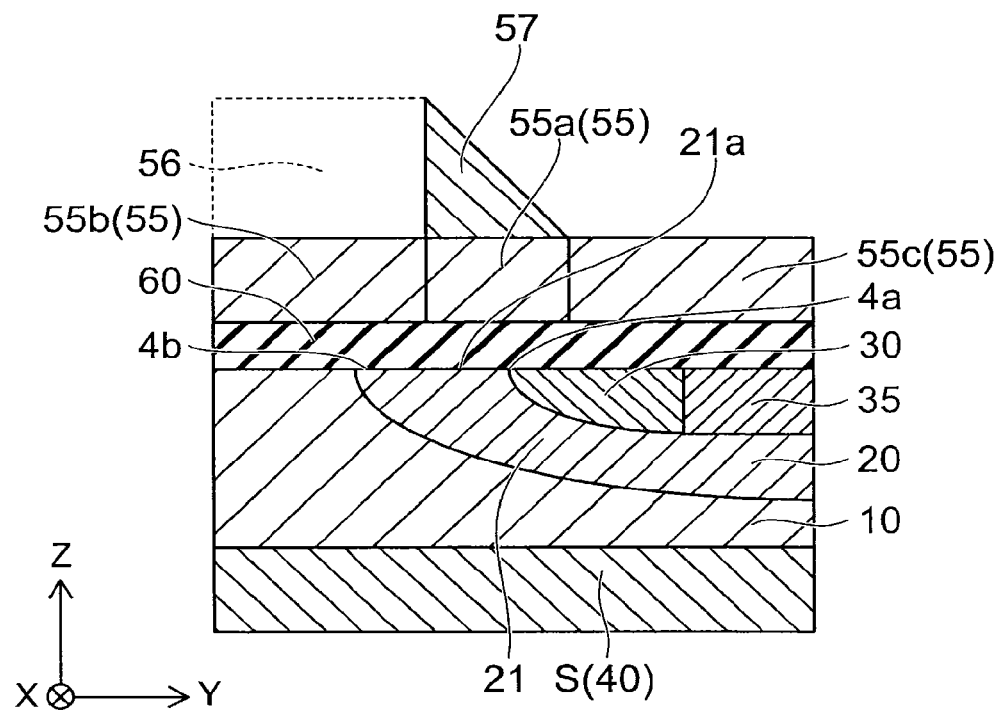

Next, as shown in FIG. 10B, the polysilicon film 55 except the portion 55a in which the silicon nitride film 57 exists is exposed by peeling off the silicon oxide film 56. Thereafter, the n-type impurity is introduced according to an ion-implantation into the exposed polysilicon film 55. As a result, in the portion 55a of the polysilicon film 55 below the silicon nitride film 57, a state in which the p-type impurity is introduced is maintained. Further, the n-type impurity is introduced into the portions 55b and 55c of the polysilicon film 55 in which the silicon nitride film 57 is not formed.

Figure 11A:
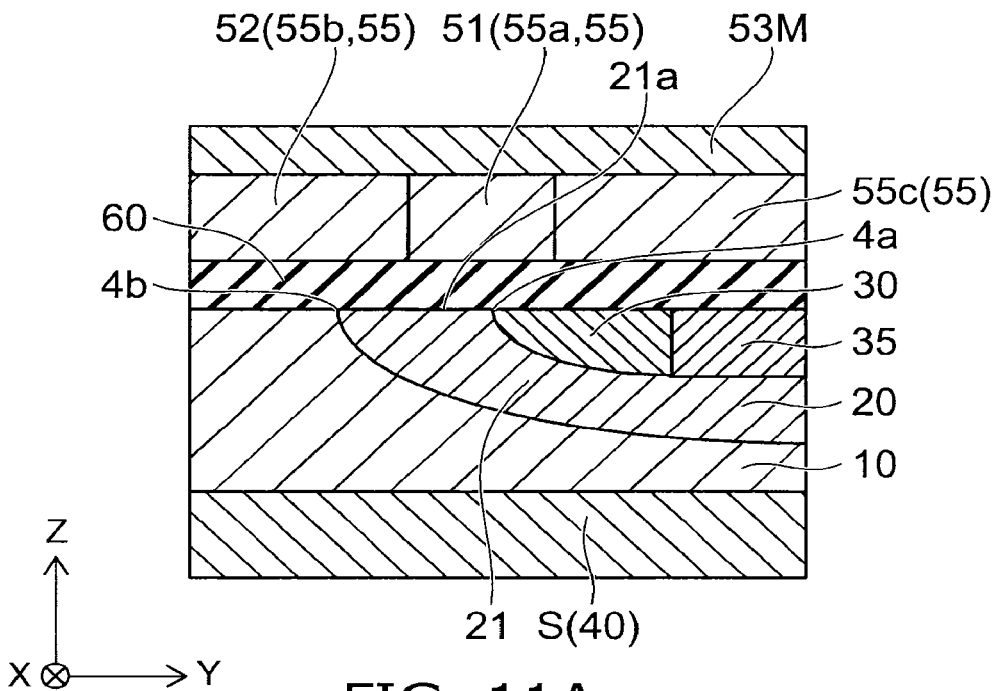

Next, an activation of the impurity which is introduced into the polysilicon film 55 is carried out by an annealing process, after peeling off the silicon nitride film 57. As a result, the portion 55a of the polysilicon film 55 becomes the first region 51, and the portion 55b of the polysilicon film 55 becomes the second region 52. Thereafter, as shown in FIG. 11A, the third region material 53M is deposited on the polysilicon film 55.

Figure 11B:
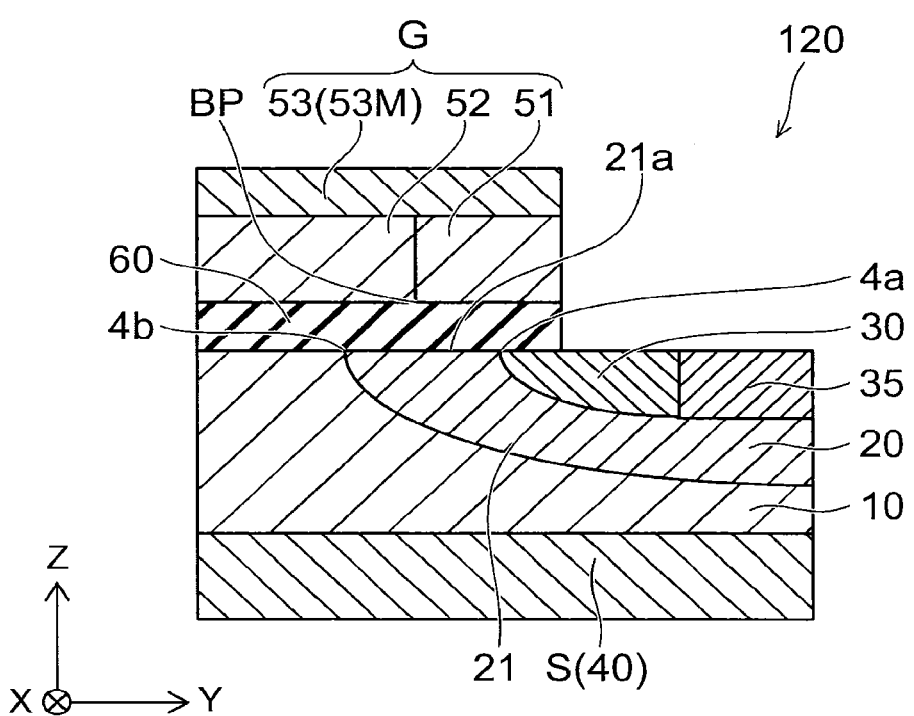

Next, as shown in FIG. 11B, by carrying out the lithography process and the etching process, the third region material 53M, a part of the polysilicon film 55 and a part of the insulating film 60 are removed. The control electrode G including the first region 51, the second region 52 and the third region 53 is formed. As a result, the semiconductor device 120 is completed.

Third Embodiment

Figure 12:
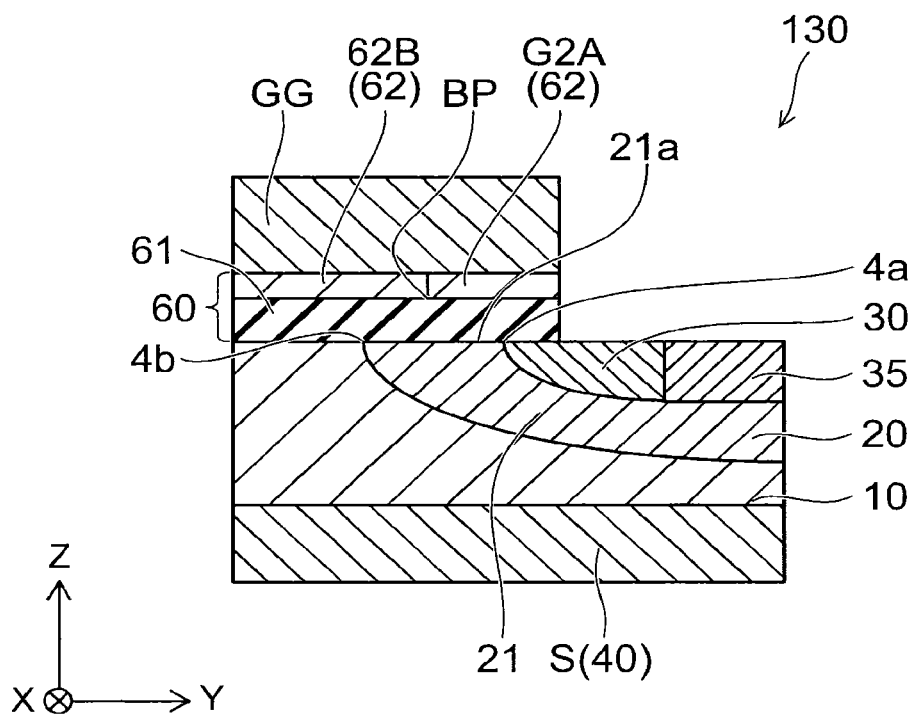
FIG. 12 is a schematic cross sectional view illustrating a configuration of a semiconductor device according to a third embodiment.

FIG. 12 is a schematic cross sectional view illustrating a configuration of a semiconductor device according to a third embodiment.

A schematic enlarged cross sectional view of the periphery of the control electrode G is shown in FIG. 12.

As shown in FIG. 12, a semiconductor device 130 according to the third embodiment is provided with the first semiconductor region 10, the second semiconductor region 20, the third semiconductor region 30, the insulating film 60 and a control electrode GG.

In the semiconductor device 130, the fourth semiconductor region 40 is provided in the substrate S. The fourth semiconductor region 40 includes the SiC of the first conductivity type ($n^+$-type). The fourth semiconductor region 40 is provided in the direction (the Z direction) which is orthogonal to the first main surface 21a so as to be spaced from the second semiconductor region 20. The fourth semiconductor region 40 is the drain region of the MOSFET. The semiconductor device 130 mentioned above is the vertical type MOSFET including the SiC.

The fifth semiconductor region 35 is provided in the semiconductor device 130. The fifth semiconductor region 35 is provided in an opposite side to the channel portion 21 of the third semiconductor region 30 on the second semiconductor region 20. The fifth semiconductor region 35 includes the SiC of the second conductivity type ($p^+$-type).

In the semiconductor device 130, the insulating film 60 includes a first layer 61 and a metal oxide layer 62. The first layer 61 is provided on the first main surface 21a of the second semiconductor region 20, and the metal oxide layer 62 is provided on the first layer 61.

The metal oxide layer 62 has a first region 62A close to the third semiconductor region 30 side, and a second region 62B closer to the first semiconductor region 10 side than the first region 62A. An effective work function of the first region 62A is larger than an effective work function of the second region 62B.

In the semiconductor device 130 according to the embodiment, the threshold value of the gate voltage is adjusted without deteriorating the current and voltage property in the same manner as the semiconductor device 110 according to the first embodiment, by the insulating film 60.

Next, a description will be given of a specific example of the semiconductor device 130 according to the third embodiment.

As shown in FIG. 12, the fourth semiconductor region 40, the first semiconductor region 10, the second semiconductor region 20, the third semiconductor region and the fifth semiconductor region 50 on the substrate S are the same as the first embodiment.

The insulating film 60 is provided at least on the first surface 21a of the second semiconductor region 20. For example, the silicon oxide added the nitrogen is used in the first layer 61 of the insulating film 60. In the metal oxide layer 62 which is provided on the first layer 61, a metal element included in the first region 62A is at least one of Al and Mg. In the metal oxide layer 62, the metal element included in the second region 62B is, for example, at least one of La, Dy, Sr and Ba. It is configured such that an effective work function of the first region 62A becomes larger than an effective work function of the second region 62B, by selecting a material of each of the first region 62A and the second region 62B.

A material of the control electrode GG is, for example, at least one which is selected from the n-type or p-type silicon, TiN, W, Al, TaN and NiSi.

Thicknesses of the first region 62A and the second region 62B of the metal oxide layer 62 are thinner than a thickness of the control electrode GG, for example, not less than 0.1 nm and not more than 1 nm.

The first region 62A and the second region 62B of the metal oxide layer 62 are formed by carrying out the lithography process and the etching process after depositing the metal oxide on the first layer 61 of the insulating film 60. Further, the first region 62A and the second region 62B of the metal oxide layer 62 may be formed by forming the first layer 61 of the insulating film 60, depositing the metal mentioned above included in the first region 62A and the second region 62B thereon, and thereafter oxidizing the metal by heating at a higher temperature than a room temperature.

A boundary position BP' between the first region 62A and the second region 62B is provided at a position which overlaps the first main surface 21a as view in the direction (the Z direction) which is orthogonal to the first main surface 21a. Further, it is desired that a distance in the Y direction from the drain end 4b to the boundary position BP becomes shorter than a distance in the Y direction from the source end 4a to the boundary position BP'.

In the semiconductor device 130 mentioned above, the threshold value of the gate voltage is adjusted without deteriorating the current and voltage characteristic by configuring the insulating film 60 having the boundary position BP' as mentioned above.

Fourth Embodiment

Figure 13:
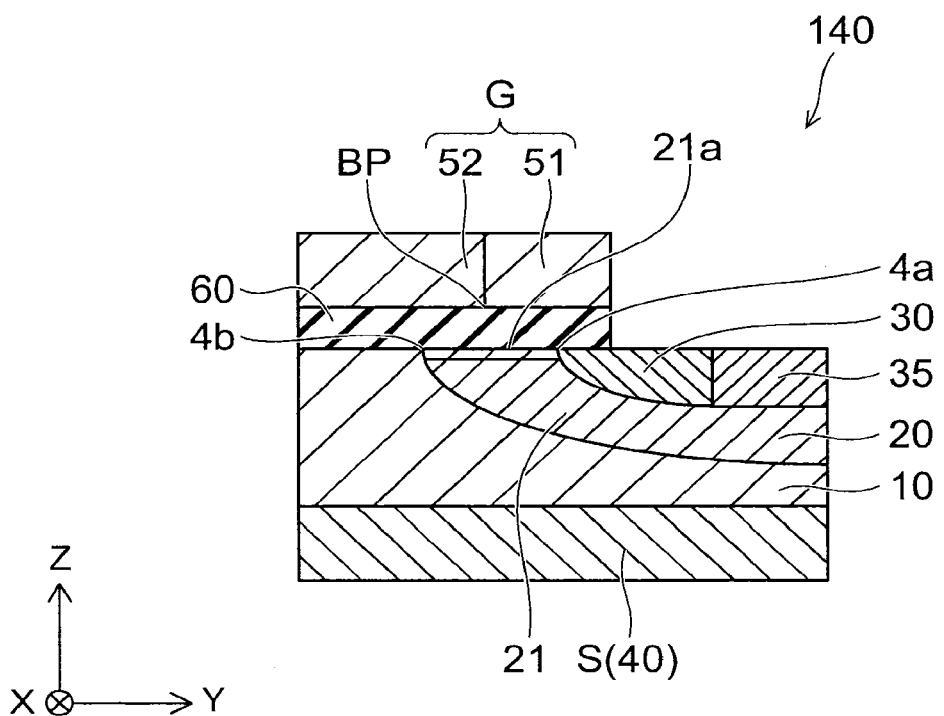
FIG. 13 is a schematic cross sectional view illustrating a configuration of a semiconductor device according to a fourth embodiment.

FIG. 13 is a schematic cross sectional view illustrating a configuration of a semiconductor device according to a fourth embodiment.

As shown in FIG. 13, in a semiconductor device 140 according to the fourth embodiment, a region 22 into which the n-type impurity is introduced is provided in a surface layer of the channel portion 21 of the second semiconductor region 20.

The semiconductor device 140 in which the region 22 mentioned above is provided in the surface layer of the channel portion 21 is a depletion type MOSFET.

In the semiconductor device 140 shown in FIG. 13, the region 22 is provided in the surface layer of the channel portion 21 of the semiconductor device 110 according to the first embodiment shown in FIG. 1B, however, the region 22 may be provided in the surface layer of the channel portion 21 of the semiconductor device 120 according to the second embodiment, and the semiconductor device 130 according to the third embodiment.

Even in the semiconductor device 140 which is the depletion type MOSFET mentioned above, the threshold value of the gate voltage can be adjusted without deteriorating the current and voltage property, in the same manner as the semiconductor device 110 according to the first embodiment.

Fifth Embodiment

Figure 14:
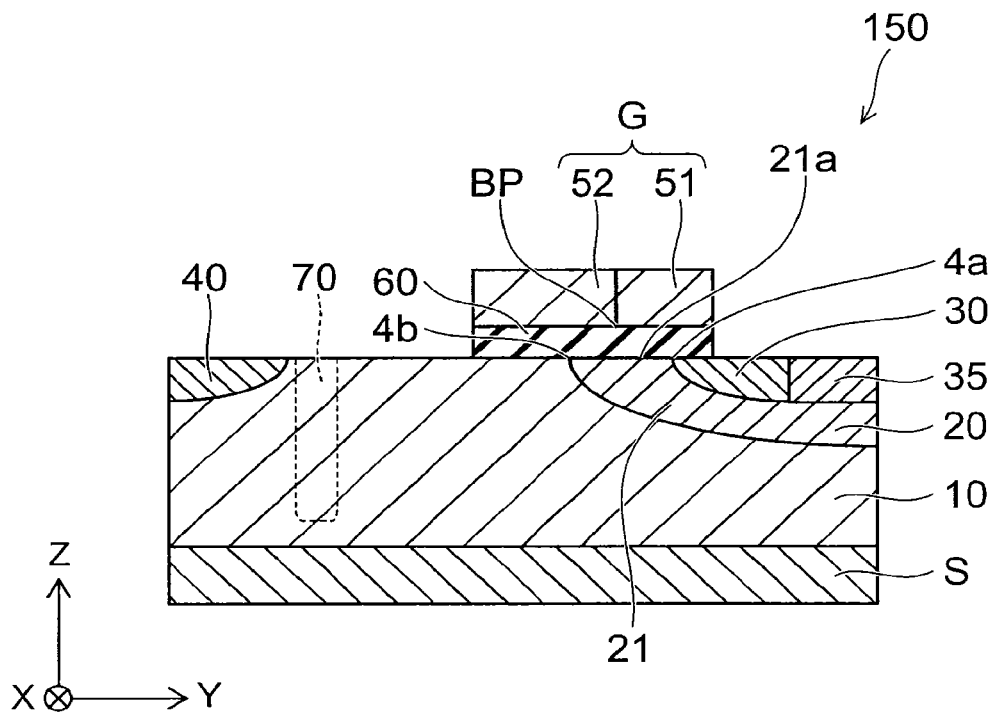
FIG. 14 is a schematic cross sectional view illustrating a configuration of a semiconductor device according to a fifth embodiment.

FIG. 14 is a schematic cross sectional view illustrating a configuration of a semiconductor device according to a fifth embodiment.

As shown in FIG. 14, in a semiconductor device 150 according to the fifth embodiment, the fourth semiconductor region 40 is provided in the direction (the Y direction) along the first main surface 21a of the second semiconductor region 20 so as to be spaced from the second semiconductor region 20. In other words, the semiconductor device 150 is a transverse type MOSFET including SiC.

In the semiconductor device 150, an insulating region 70 may be provided between the second semiconductor region 20 and the fourth semiconductor region 40, in the first semiconductor region 10. The insulating region 70 is configured such that an insulating material is embedded within a trench which is formed at a predetermined depth from the surface of the first semiconductor region 10. By providing the insulating region 70, an effective distance between the second semiconductor region 20 and the fourth semiconductor region 40 becomes longer, and a breakdown voltage is improved.

Even in the semiconductor device 150 which is the transverse type MOSFET mentioned above, the threshold value of the gate voltage can be adjusted without deteriorating the current and voltage property, in the same manner as the semiconductor device 110 according to the first embodiment.

Sixth Embodiment

Figure 15:
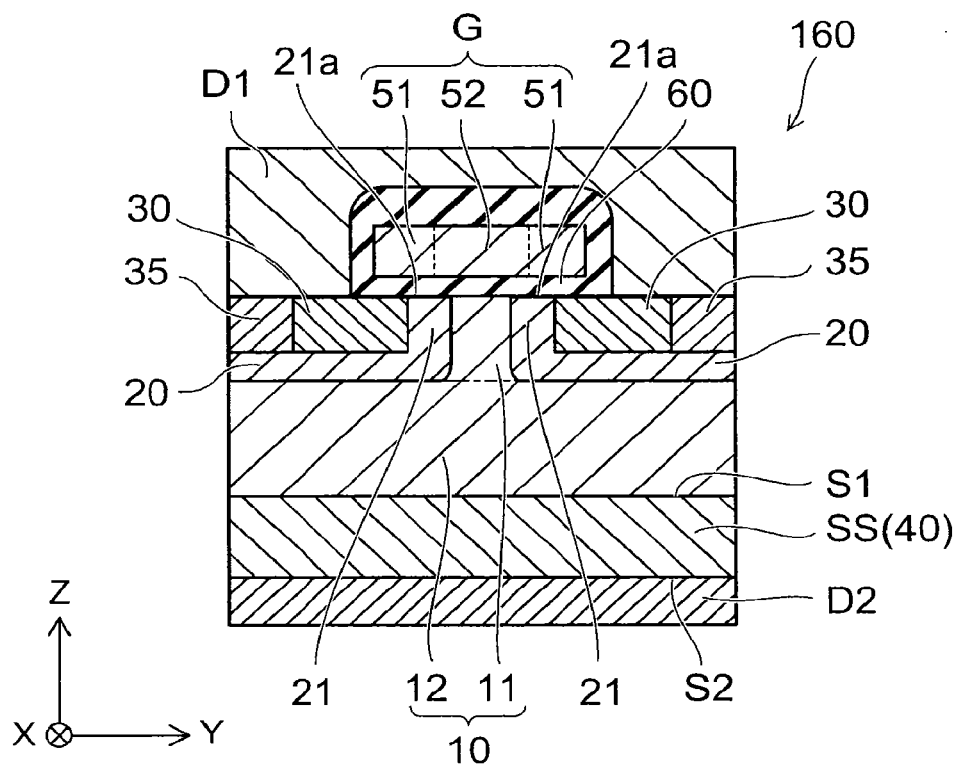
FIG. 15 is a schematic cross sectional view illustrating a configuration of a semiconductor device according to a sixth embodiment.

FIG. 15 is a schematic cross sectional view illustrating a configuration of a semiconductor device according to a sixth embodiment.

As shown in FIG. 15, a semiconductor device 160 according to the sixth embodiment is an insulated gate bipolar transistor (IGBT).

In the semiconductor device 160, a conductivity type of a substrate SS is different from the conductivity type of the substrate S of the semiconductor device 110 according to the first embodiment. In other words, while the conductivity type of the substrate S of the semiconductor device 110 is the $n^+$-type, the conductivity type of the substrate SS of the semiconductor device 160 is the $p^+$-type. The semiconductor device 160 is the same as the semiconductor device 110 except a point that the conductivity types of the substrates sS and SS are different.

The substrate SS is a hexagonal SiC substrate which includes an impurity, for example, Al at an impurity concentration appropriately not less than $5\times10^{18}$ cm$^{-3}$ and not more than $1\times10^{19}$ cm$^{-3}$ as the p-type impurity. In the semiconductor device 160 corresponding to the IGBT, the control electrode G is a gate electrode, the first electrode D1 is an emitter electrode, and the second electrode D2 is a collector electrode.

Even in the semiconductor device 160 corresponding to the IGBT mentioned above, the threshold value of the gate voltage is adjusted without deteriorating the current and voltage property, in the same manner as the semiconductor device 110 according to the first embodiment.

As described above, according to the semiconductor device according to the embodiment, it is possible to adjust the threshold value of the gate voltage without deteriorating the current and voltage property.

The embodiments and the variations are described above, however, the invention is not limited to these examples. For example, even if those skilled in the art appropriately adds and deletes the configuration elements, and apply design changes to each of the embodiments and the variations, or appropriately combines the features of each of the embodiments, they are included in the scope of the invention as long as they are provided with the gist of the invention.

For example, in each of the embodiments and each of the variations mentioned above, the description is given by setting the first conductivity type to the n-type and the second conductivity type to the p-type, however, the invention can be executed if the first conductivity type is set to the p-type and the second conductivity type is set to the n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first semiconductor region including a silicon carbide of a first conductivity type;
    a second semiconductor region including a silicon carbide of a second conductivity type;
    a third semiconductor region including the silicon carbide of the first conductivity type, the second semiconductor region provided between the first semiconductor region and the third semiconductor region,
    a control electrode provided apart from the second semiconductor region in a first direction, the first direction being perpendicular to a second direction from the first semiconductor region toward the third semiconductor region, and
    an insulating film provided between the second semiconductor region and the control electrode,
    the second semiconductor region having a surface on a side of the control electrode, the surface includes a first end and a second end, the first end being provided on a side of the first semiconductor region, the second end being provided on a side of the third semiconductor region,
    the control electrode including a first electrode region and a second electrode region, the first electrode region overlapping the second end, the second electrode region overlapping the first end, at least a part of the second electrode region overlapping the first electrode region in the second direction,
    the control electrode having a boundary between the first electrode region and the part of the second electrode region, the surface overlapping the boundary in the first direction,
    an effective work function of the first electrode region being larger than an effective work function of the second electrode region, and
    X/L being more than 0 and less than 0.5, the X being a distance between the first end and an imaginary extension of the boundary position BP in the second direction, the L being a distance in the second direction between the first end and the second end.

2. The device according to claim 1, wherein the control electrode includes a third electrode region, the first electrode region is provided between the third electrode region and the insulating film, and the second electrode region is provided between the third electrode region and the insulating film.

3. The device according to claim 2, wherein an electric resistance of the third electrode region is lower than an electric resistance of the first electrode region and lower than an electric resistance of the second electrode region.

4. The device according to claim 1, wherein the first electrode region and the second electrode region include a polysilicon, the polysilicon includes an impurity.

5. The device according to claim 4, wherein the first electrode region is of a second conductivity type and the second electrode region is of a first conductivity type.

6. The device according to claim 1, wherein the insulating film includes a silicon oxide, the silicon oxide includes a nitrogen.

7. The device according to claim 1, wherein a composition of an element included in the first electrode region is different from a composition of an element included in the second electrode region.

8. The device according to claim 1, further comprising a fourth semiconductor region including the silicon carbide of the first conductivity type, and
the fourth semiconductor region being apart from the second semiconductor region in the first direction.

9. The device according to claim 1, further comprising a fourth semiconductor region including the silicon carbide of the first conductivity type, and
the fourth semiconductor region being apart from the second semiconductor region in the second direction.

10. The device according to claim 1, further comprising:
a fourth semiconductor region contacting the first semiconductor region, the fourth semiconductor region including the silicon carbide of the first conductivity type;
a first electrode electrically connected with the third semiconductor region; and
a second electrode electrically connected with the fourth semiconductor region.

11. The device according to claim 10, further comprising:
a substrate provided between the first semiconductor region and the second electrode, the substrate including a silicon carbide.

12. The device according to claim 11, wherein the substrate has the first conductivity type.

13. The device according to claim 11, wherein the substrate has the second conductivity type.

14. A semiconductor device comprising;
a first semiconductor region including a silicon carbide of a first conductivity type;
a second semiconductor region including a silicon carbide of a second conductivity type;
a third semiconductor region including the silicon carbide of the first conductivity type, the second semiconductor region provided between the first semiconductor region and the third semiconductor region,
a control electrode provided apart from the second semiconductor region in a first direction, the first direction being perpendicular to a second direction from the first semiconductor region toward the third semiconductor region;
a metal oxide layer provided between the second semiconductor region and the control electrode; and
an insulating film provided between the metal oxide layer and the second semiconductor region,
the second semiconductor region having a surface on a side of the control electrode, the surface includes a first end and a second end, the first end being provided on a side of the first semiconductor region, the second end being provided on a side of the third semiconductor region,
the metal oxide layer including a first metal oxide region and a second metal oxide region, the first metal oxide region overlapping the second end, the second metal oxide region overlapping the first end, at least a part of the second metal oxide region overlapping the first metal oxide region in the second direction,
the metal oxide layer having a boundary between the first metal oxide region and the part of the second metal oxide region, the surface overlapping the boundary in the first direction,
an effective work function of the first metal oxide region being larger than an effective work function of the second metal oxide region, and
X/L being more than 0 and less than 0.5, the X being a distance between the first end and an imaginary extension of the boundary position BP in the second direction, the L being a distance in the second direction between the first end and the second end.

15. The device according to claim 14, wherein the insulating film includes a first layer provided between the surface and the metal oxide layer, and the first layer includes a silicon oxide including a nitrogen.

* * * * *